(12) United States Patent
Shyu et al.

(10) Patent No.: US 7,457,342 B2
(45) Date of Patent: Nov. 25, 2008

(54) LASER DEVICE

(75) Inventors: San-Woei Shyu, Taipei (TW); Guo-Zen Chen, Taipei (TW); Ming-Hua Wen, Taipei (TW); I-Lin Chu, Taipei (TW)

(73) Assignee: E-Pin Optical Industrial Co., Ltd., Taipei (TW)

( * ) Notice: Subject to any disclaimer, the term of this patent is extended or adjusted under 35 U.S.C. 154(b) by 64 days.

(21) Appl. No.: 11/385,806

(22) Filed: Mar. 22, 2006

(65) Prior Publication Data

US 2007/0147461 A1 Jun. 28, 2007

(30) Foreign Application Priority Data

Dec. 23, 2005 (CN) .............................. 94 1 46091

(51) Int. Cl.
*H01S 3/08* (2006.01)

(52) U.S. Cl. ....................... 372/101; 372/107
(58) Field of Classification Search ........................ None
See application file for complete search history.

(56) References Cited

U.S. PATENT DOCUMENTS

| | | | | |
|---|---|---|---|---|
| 3,709,606 A | * | 1/1973 | Kato et al. | 356/512 |
| 4,661,959 A | * | 4/1987 | Kaneko | 372/34 |
| 4,697,880 A | * | 10/1987 | Angerstein et al. | 362/259 |
| 5,758,950 A | * | 6/1998 | Naoe et al. | 362/259 |
| 6,179,444 B1 | * | 1/2001 | Plesko | 362/259 |
| 6,687,283 B2 | * | 2/2004 | Naoe | 372/107 |
| 6,928,100 B2 | * | 8/2005 | Sato et al. | 372/109 |

\* cited by examiner

*Primary Examiner*—Minsun Harvey
*Assistant Examiner*—Sean Hagan
(74) *Attorney, Agent, or Firm*—Troxell Law Office, PLLC (57) ABSTRACT

A laser device applied to a light source of laser scanning units (LSU) including a laser diode disposed on an accommodation hole of a flange. A collimator lens is arranged on one end of an inner tube part of a holder while the other end of the inner tube part faces the laser diode. The laser beam passes through the inner tube part of the holder and the collimator lens, then projects out. A lug extends radially from outer surface of the holder and a plurality of axial guide slots are disposed on the lug. A plurality of guide pins corresponding to the guide slots are arranged on the flange. An adhesive is located between the guide pins and the guide slots and spaced apart from the collimator lens.

11 Claims, 11 Drawing Sheets

LASER DEVICE

BACKGROUND OF THE INVENTION

The present invention relates to a laser device applied to a light source of laser scanning units (LSU), especially to a laser device that connects a laser with a collimator by guide pins for calibration and adhesion.

A conventional Laser Beam Printer includes a Laser Scanning Unit that uses a laser diode as a light source. A light beam emitted from the laser diode passes a collimator lens and becomes a parallel light bean, then through a cylinder lens for converging the light beam that passes along Y axis of a sub-major scanning direction, and directly transmits the light beams along X-axis of a main scanning direction so as to form a line image. A high-speed polygon mirror that deflects the at least one light beam is disposed near or in focus of above image for controlling projecting direction of the laser beam so as to make the laser beam move parallel to X-axis of the main scanning direction in a constant angular velocity, and then being deflected to a fθ lens. The fθ lens projects the light beams deflected from the polygon mirror onto a photoconductive drums so as to achieve requirement of scanning linearity.

Refer to Japanese patent application No. 08-112940, Japanese patent application No. 09-218368 and U.S. Pat. No. 6,928,100, in most of conventional laser scanning units, the laser diode and the collimator lens are integrated into a part. Jigs are used for X axis, Y axis, and Z axis calibration composed by calibration of X, and Y axes of laser beam and calibration of Z axis while focusing. Then the laser diode and the collimator lens are fixed and positioned by the UV-curing type adhesive or other photo-curing type adhesives. The UV-curing type adhesive can be pre-coated on the position intended to connect and then is irradiate for hardening by UV light after calibration. However, the design of the laser device is not ideal. Refer to Japanese patent application No. 08-112940, a holder disposed with a collimator lens is arranged on front end of the holder with a laser diode while the UV-curing type adhesive is painted between the inner tube and outer tube of two holders so that there is a trouble of irradiating the UV light on the UV-curing type adhesive. Thus the adhesion strength and calibration efficiency have been influenced. Refer to Japanese patent application No. 09-218368, part of the circular surface of the collimator lens is disposed on front end of the holder with a laser diode while the UV-curing type adhesive is filled between part of the circular surface of the collimator lens and the holder. Although the UV light can irradiate the UV-curing type adhesive, the UV-curing type adhesive may contact the holder and cause trouble of coating the adhesive. Because the collimator lens is attached on the holder just by the circular surface, the adhesion strength is not enough and easy to get damage while being bumped. Moreover, refer to U.S. Pat. No. 6,928,100, a laser device includes a light source, a lens and a holder having a tubular portion for holding said light source and said lens is disclosed. The tubular portion has a plurality of holding portions, each holding the collimator lens in a circumferential direction, and a plurality of notch portions each not holding said lens, and the holding portions and the notch portions are alternately provided in a circumferential direction of the tubular portion. The UV-curing type adhesive is coated between the collimator and inner surface of the holding portions. Although the UV-curing type adhesive can be irradiated by the UV light and the adhesion strength is assured, the UV-curing type adhesive may still contact with the collimator lens and cause trouble.

SUMMARY OF THE INVENTION

Therefore it is a primary object of the present invention to provide a laser device that includes a laser diode disposed on a flange. And an inner tube part of a holder is disposed with a collimator lens on one end while the other end of the inner tube part faces the laser diode so that the laser beam passes through the inner tube part of the holder and the collimator lens, then projects out. At least one lug extends radically from outer surface of the holder and a plurality of axial guide slots is disposed on the lug. A plurality of guide pins corresponding to the guide slots is arranged on the flange. By assembling as well as adjustment between the guide pins and the guide slots, and adhesion of the UV-curing type adhesive, the laser diode and the collimator lens are integrated into one part so as to increase the adhesion strength and prevent the collimator lens from contacting the adhesive while coating the UV-curing type adhesive by conventional techniques.

It is another object of the present invention to provide a laser device that assembles the flange with the holder by combination of the axial guide pins on the flange with the corresponding axial guide slots on the holder. The guide pin can be two-guide-pin type, three-guide-pin type, or four-guide-pin type and is applied according to different jigs for calibration of X axis, Y axis, and Z axis and the adhesion strength is also enhanced.

It is a further object of the present invention to provide a laser device that a plurality of axial guide slots on the lug can be close-ended or open-ended so as to simplify operations of coating adhesives and UV light irradiation, increase operation efficiency and enhance adhesion strength.

DETAILED DESCRIPTION OF THE PREFERRED EMBODIMENT

Figure 1:
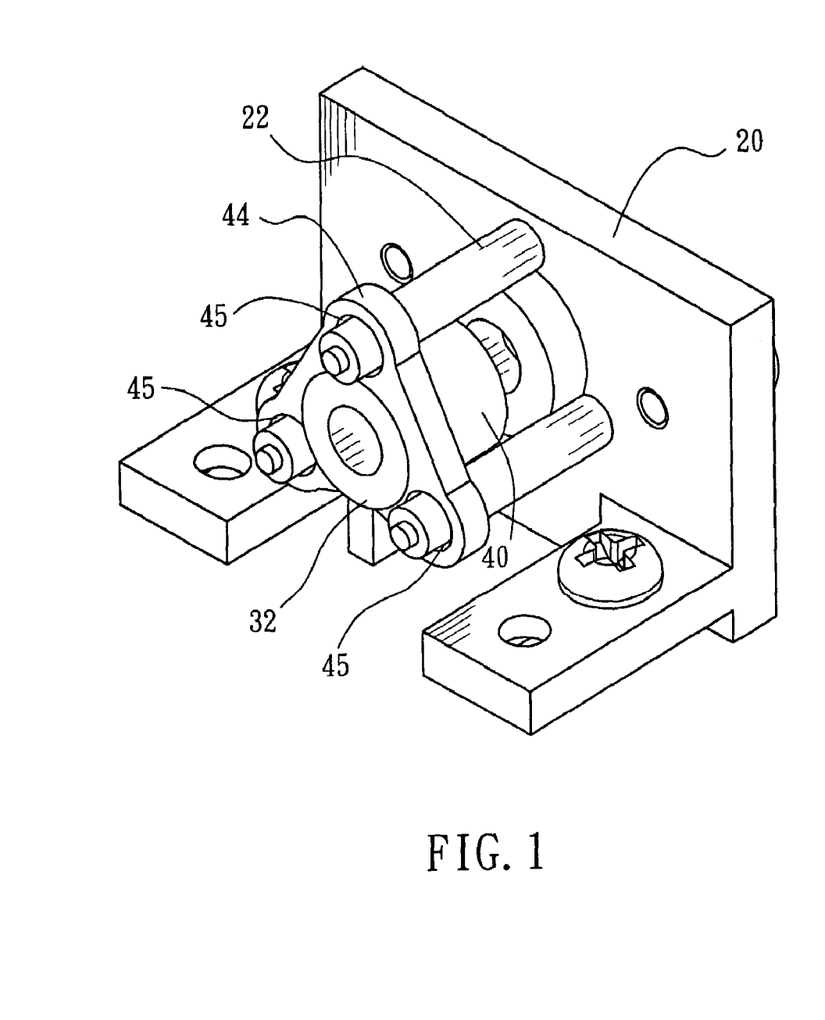
FIG. 1 is a perspective view of a three-guide-pin laser device with a close-ended guide slot in accordance with the present invention.
Figure 2:
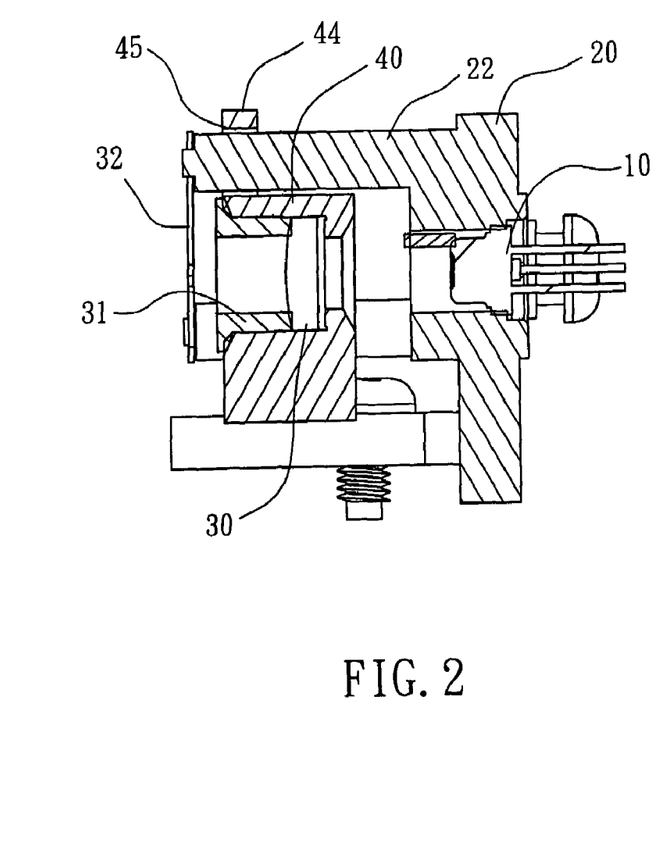
FIG. 2 is a sectional arrangement drawing of the embodiment in FIG. 1.
Figure 3:
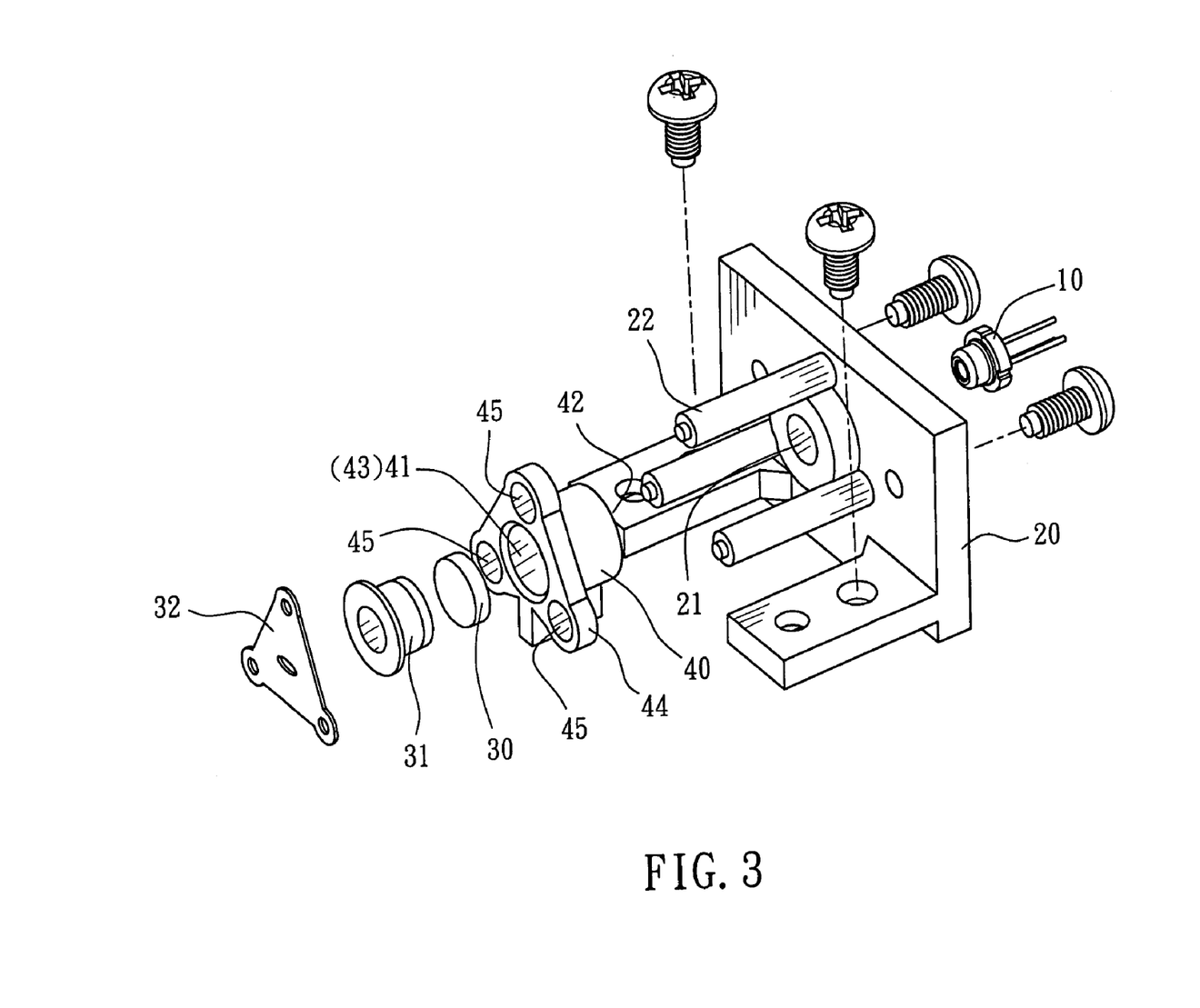
FIG. 3 is an explosive view of the embodiment in FIG. 1.
Figure 4:
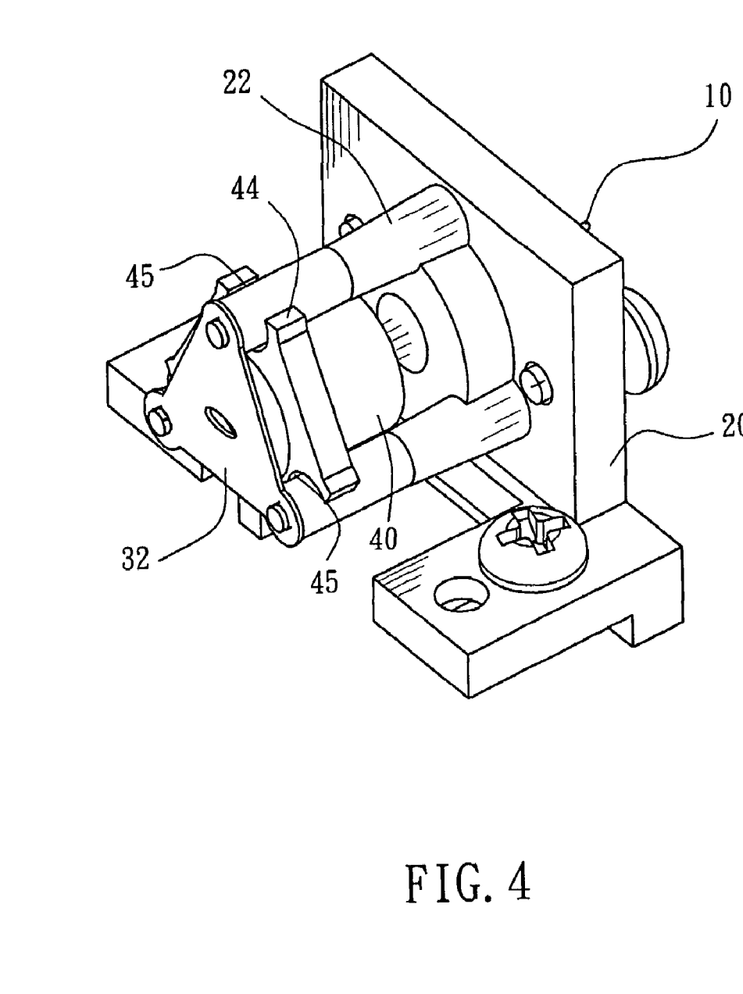
FIG. 4 is a perspective view of a three-guide-pin laser device with an open-ended guide slot in accordance with the present invention.
Figure 5:
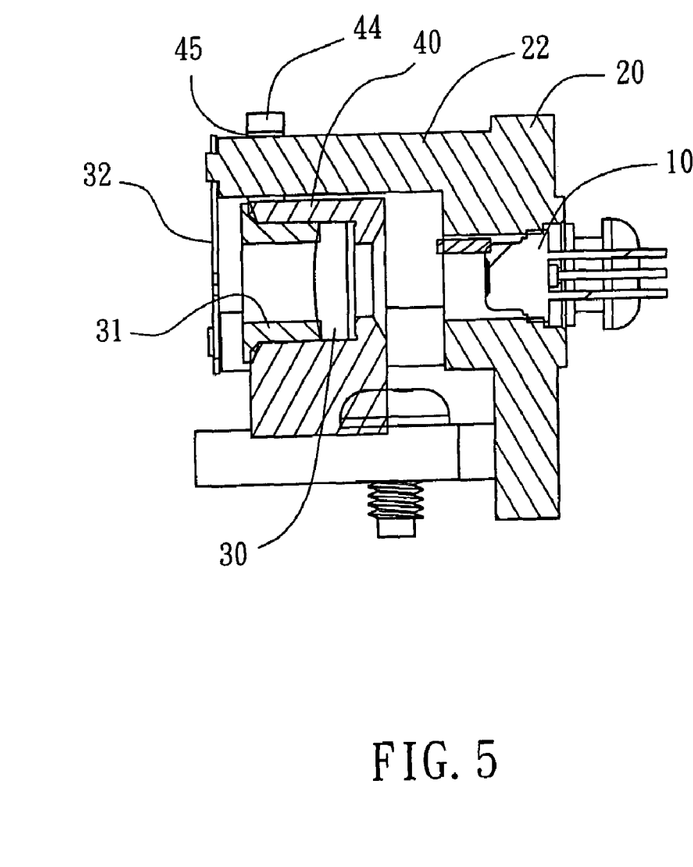
FIG. 5 is a sectional arrangement drawing of the embodiment in FIG. 4.
Figure 6:
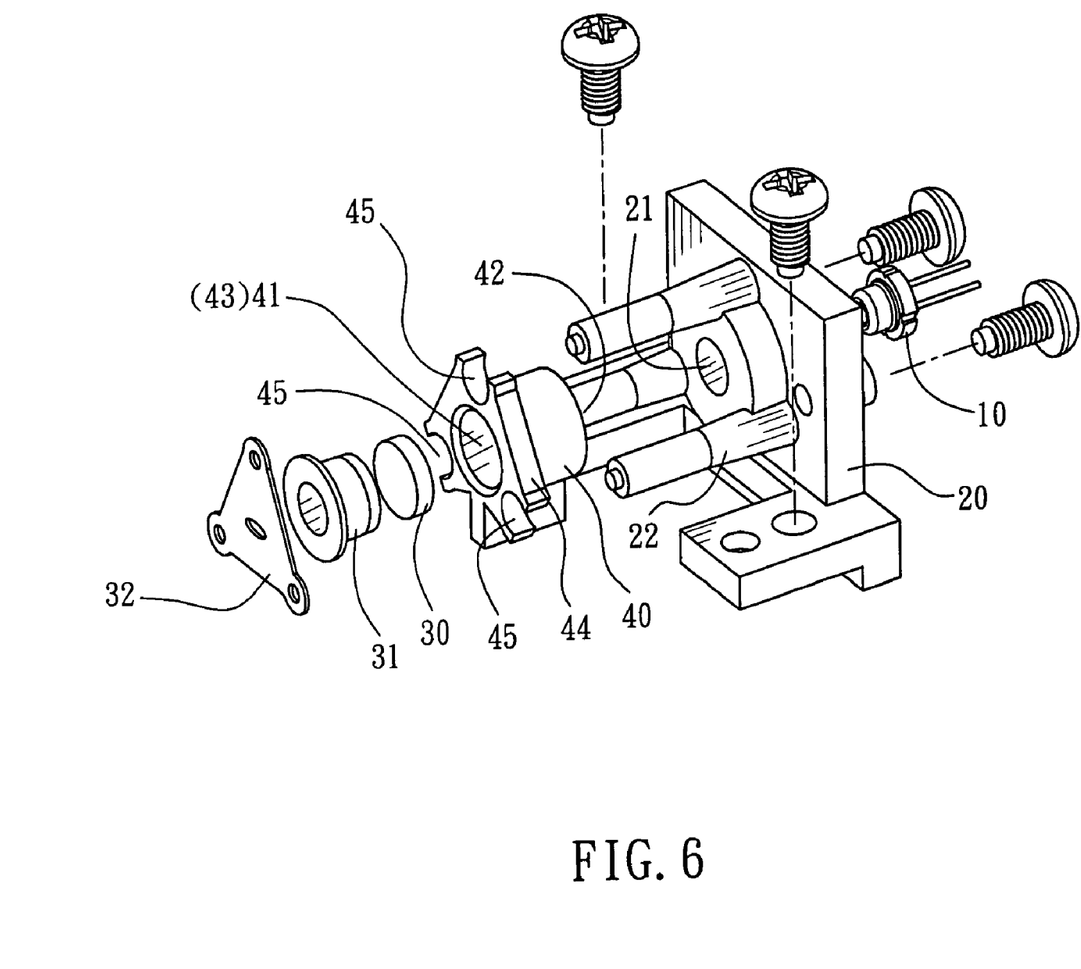
FIG. 6 is an explosive view of the embodiment in FIG. 4.
Figure 7:
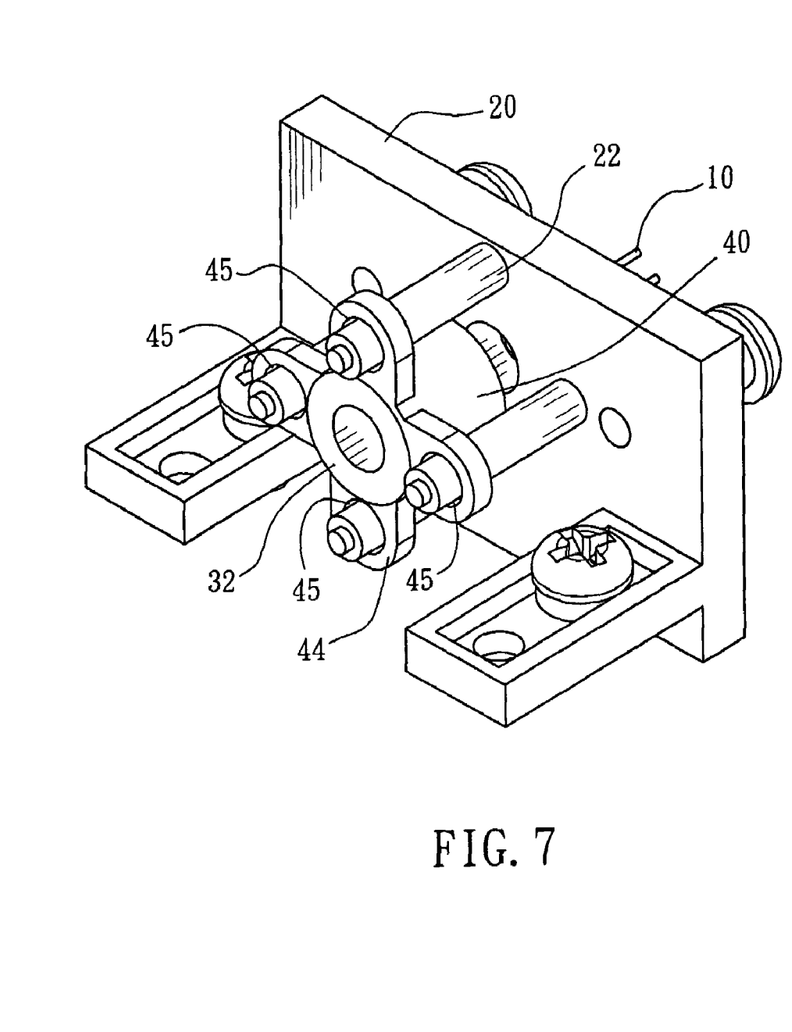
FIG. 7 is a perspective view of a four-guide-pin laser device with a close-ended guide slot in accordance with the present invention.
Figure 8:
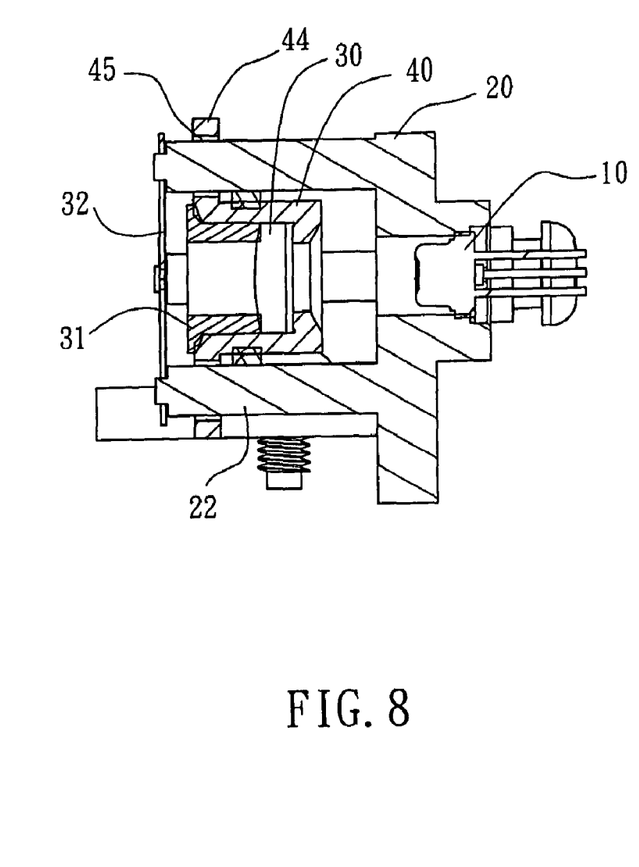
FIG. 8 is a sectional arrangement drawing of the embodiment in FIG. 7.
Figure 9:
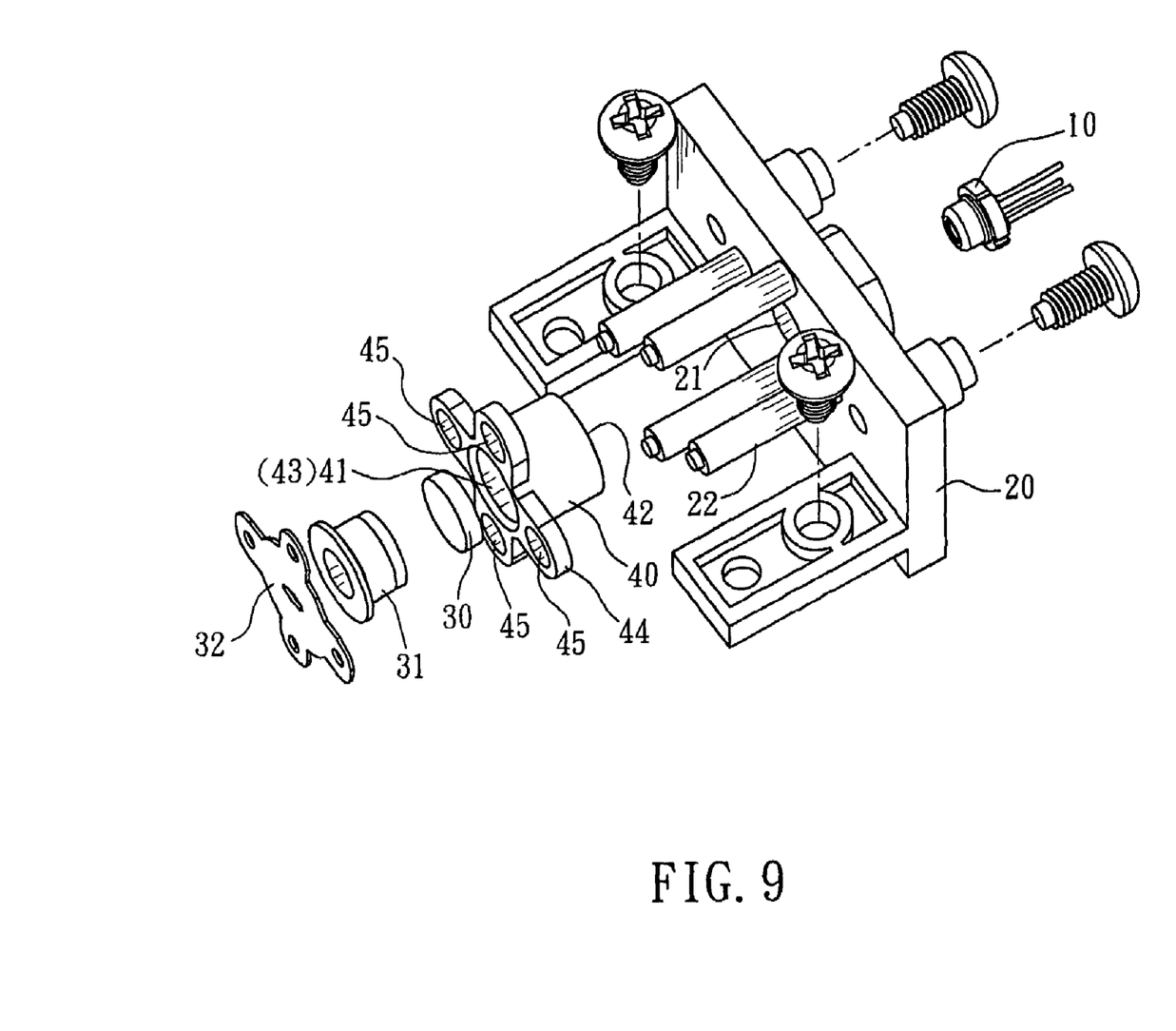
FIG. 9 is an explosive view of the embodiment in FIG. 7.
Figure 10:
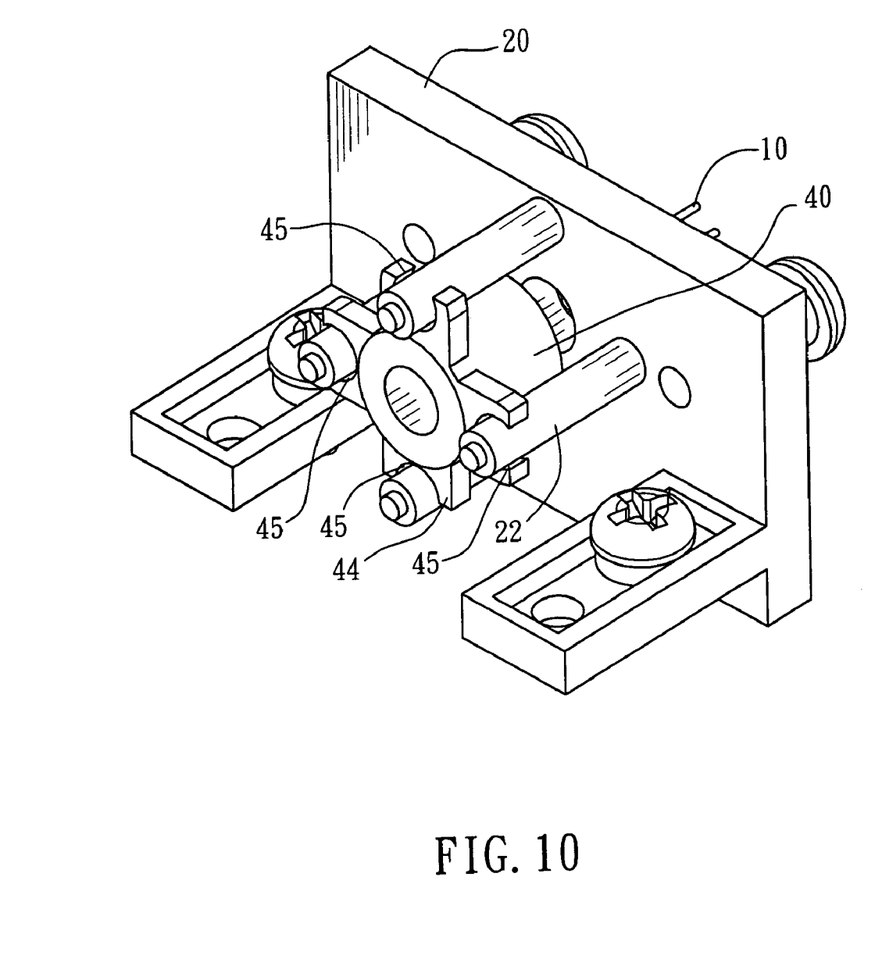
FIG. 10 is a perspective view of a four-guide-pin laser device with an open-ended guide slot in accordance with the present invention.
Figure 11:
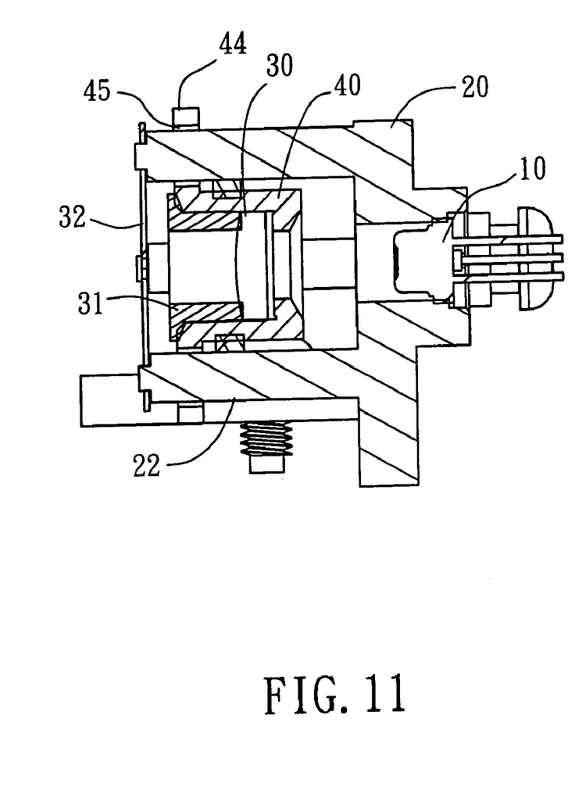
FIG. 11 is a sectional arrangement drawing of the embodiment in FIG. 10.
Figure 12:
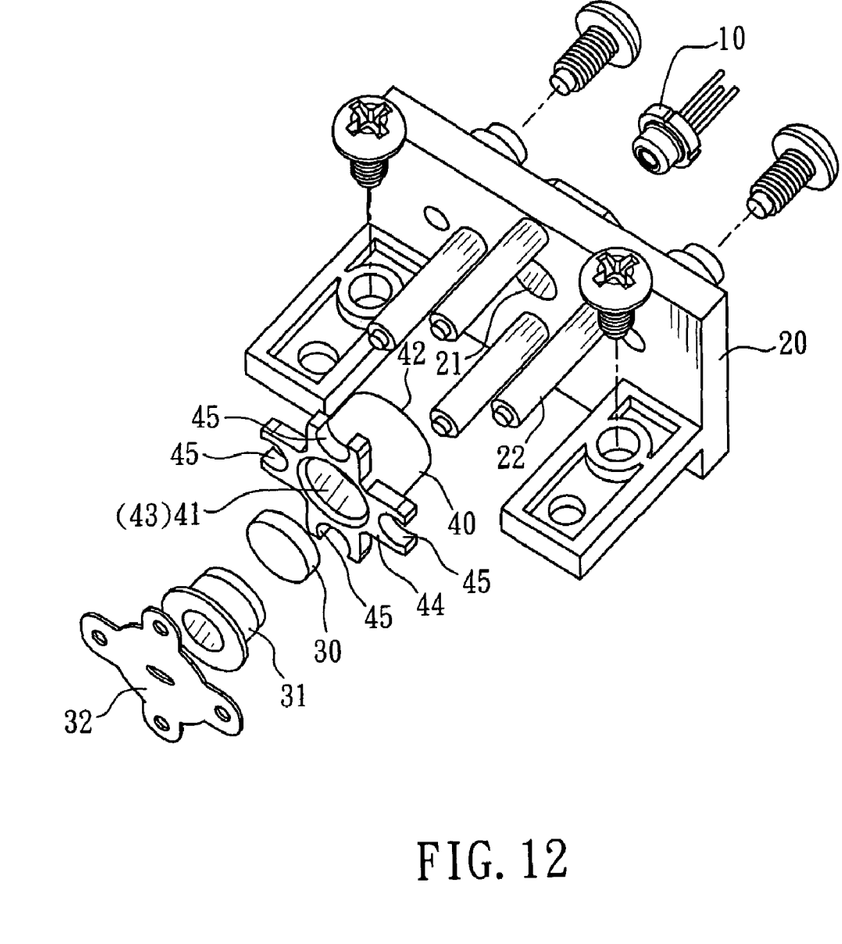
FIG. 12 is an explosive view of the embodiment in FIG. 10.
Figure 13:
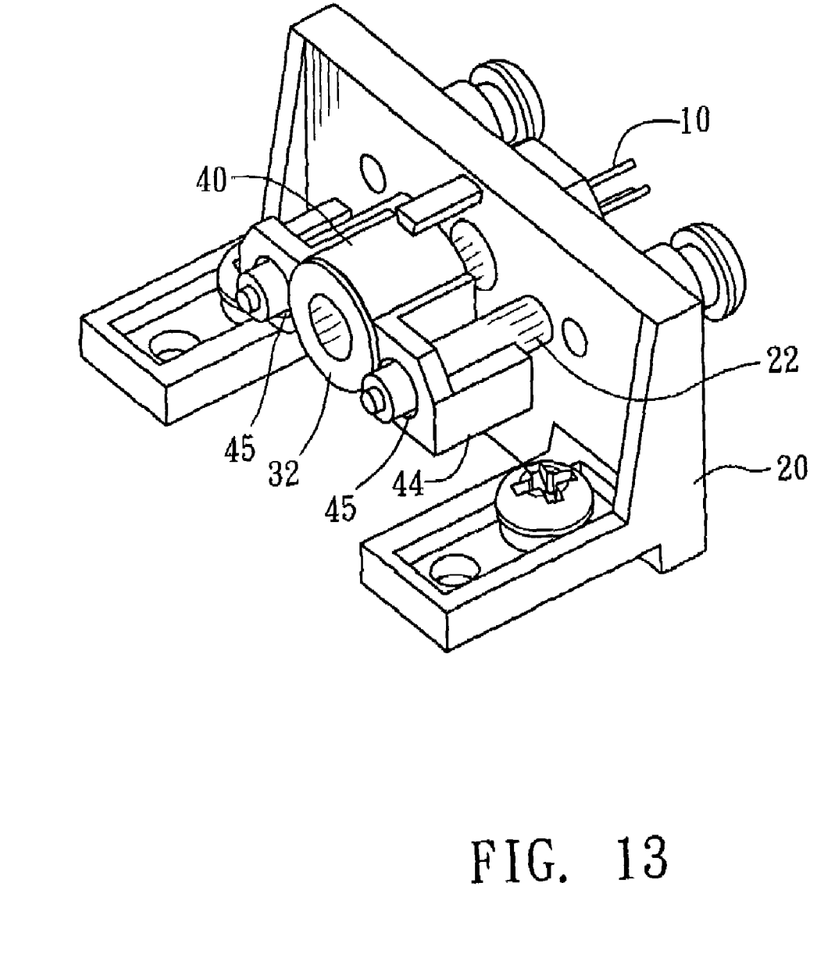
FIG. 13 is a perspective view of a two-guide-pin laser device with a close-ended guide slot in accordance with the present invention.
Figure 14:
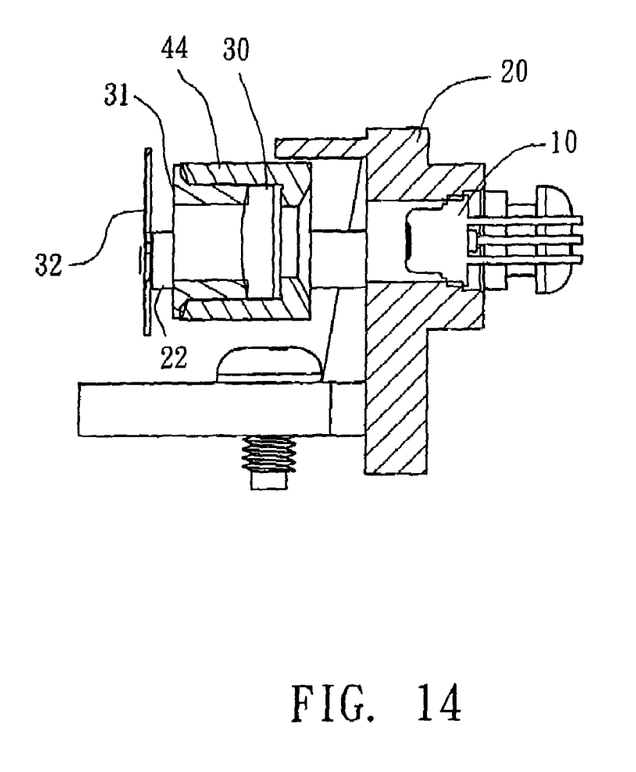
FIG. 14 is a sectional arrangement drawing of the embodiment in FIG. 13.
Figure 15:
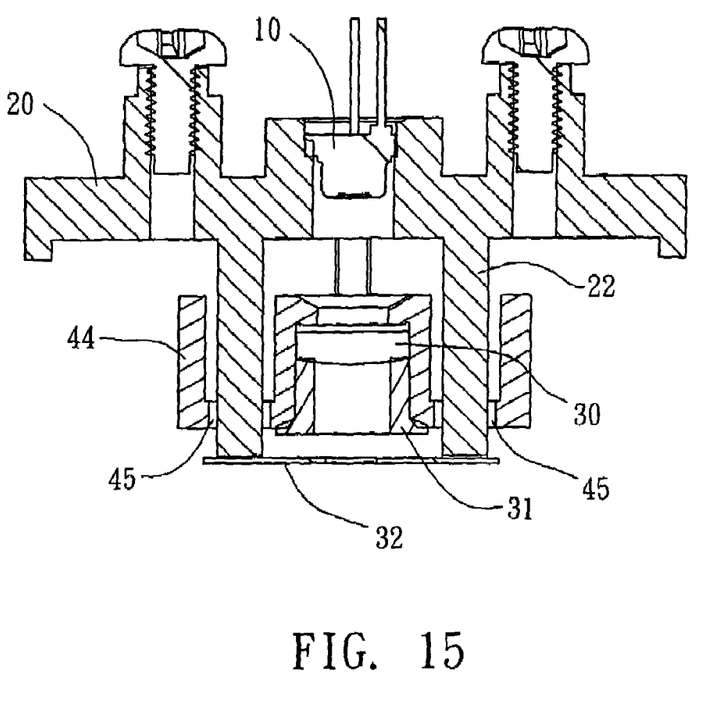
FIG. 15 is a cross-sectional view of the embodiment in FIG. 13.
Figure 16:
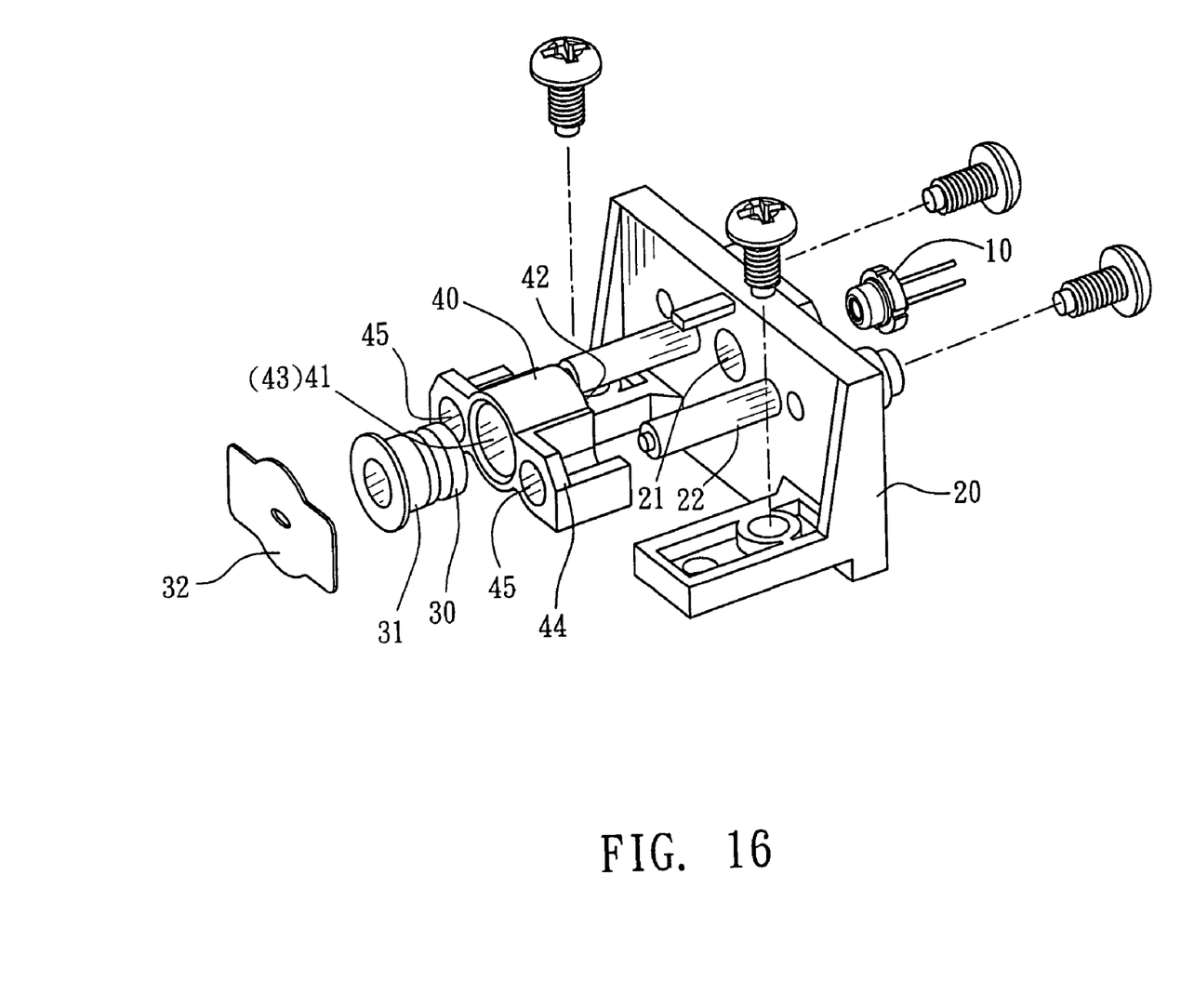
FIG. 16 is an explosive view of the embodiment in FIG. 13.

Refer from FIG. 1 to FIG. 3, a laser device according to the present invention applied to a light source of laser scanning units (LSU) consists of a laser diode 10, a flange 20, a collimator lens 30, and a holder 40 for collimator lens. The laser diode 10 is fixed on a circuit substrate and is mounted projecting inside an accommodation hole 21 on the flange 20 for emitting laser beam forwardly. The flange 20 is fastened on a housing of the laser scanning unit. The holder 40 is a tube with an inner tube part 41 while one end (rear end) 42 of the inner tube part 41 faces the laser diode 10 and the collimator lens 30 is mounted in the other end (front end) 43 of the inner tube part 41. Thus the laser beam passes through the inner tube part 41 of the holder 40 and the collimator lens 30, then projects out. In assembling, the front end of the collimator lens 30 is pressed by a ring 31 for preventing the collimator lens 30 from separating from the holder 40.

Moreover, an aperture 32 is disposed on front side of the collimator lens 30 that is located on front end 43 of the holder 40 for controlling the laser beam.

Furthermore, at least one lug 44 with certain thickness extends radically from the holder 40. A plurality of axial guide slots 45 parallel with a central axis of the inner tube part 41 of the holder 40 is disposed on the lug 44. There is no limit on the number of the guide slot 45, it can be three (shown in FIG. 1 to FIG. 3 or FIG. 4 to FIG. 6), four (shown in FIG. 7 to FIG. 9 or FIG. 10 to FIG. 12), or two (shown in FIG. 13 to FIG. 16). A plurality of guide pins 22 corresponding to the guide slots 45 is arranged on the flange 20 while the diameter of the guide pin 22 is smaller than that of the guide slot 45 so that the holder 40 is disposed on the flange 20 by the guide pin 22 inserting through the corresponding guide slot 45. And the gap between the guide slot 45 and the guide pin 22 is used as space for displacement between the guide slot 45 and the guide pin 22 so that calibration of the X, Y, and Z axes between the laser diode 10 and the collimator lens 30 is performed. The calibration includes calibration of X, and Y axes of laser beam and calibration of Z axis while focusing.

When perform calibration of the X, Y, and Z axes between the laser diode 10 and the collimator lens 30, due to various number of the guide pin 22, different jigs are used to fix the holder 40 so as to adjust the positions of the X axis, Y axis, and Z axis of the holder 40 for calibration. Moreover, before performing calibration, UV-curing type adhesive or other photo-curing type adhesives is filled in the space between the guide slot 45 and the guide pin 22. After finishing the calibration, irradiate the adhesives with UV light so as to make them harden for fixing and positioned. It is also feasible to perform the calibration first, fill the UV-curing type adhesive into the space between the guide slot 45 and the guide pin 22 and then irradiate the adhesives with UV light for hardening the adhesives. Thus the holder 40 is fixed and positioned.

The plurality of guide slots 45 on the lug 44 can be close-ended, as shown from FIG. 1 to FIG. 3, FIG. 7 to FIG. 9, and FIG. 13 to FIG. 16 or open-ended, shown from FIG. 4 to FIG. 6, and FIG. 10 to FIG. 12. The two types of the guide slots 45 are used in combination of different processing tools such as coating tools or jigs for calibration of the X, Y, and Z axes and coating UV-curing type adhesive so as to simplify operations of coating adhesives and UV light irradiation, increase operation efficiency and enhance adhesion strength.

Compare with conventional laser devices, the present invention has following advantages:

(1) While filling UV-curing type adhesive into the gap between the guide slot 45 and the guide pin 22, the adhesive will not contact with the collimator lens 30 so that the coating of the UV-curing type adhesive is simplified and so as to avoid trouble caused by contact between adhesive and the collimator lens 30 as shown in prior art—U.S. Pat. No. 6,928,100.

(2) The guide slot 45 for coating with UV-curing type adhesive is disposed on a radically lug 44 extending from outer surface of the holder 40 so that the front and rear ends of the guide slot 45 are opened and the lug 44 having certain thickness. Thus it is easy to control homogeneousness while filling the UV-curing type adhesive into the gap between the guide slot 45 and the guide pin 22. Moreover, the UV light can irradiate through the front and rear ends of the guide slot 45 so that the hardness of the UV-curing type adhesive can be controlled. Thus the adhesion strength and overall rigidity of the present invention are enhanced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A laser device comprising:
   a laser diode, a flange, a collimator lens, and a holder, wherein the laser diode emits a laser beam;
   the flange having a plurality of axial guide pins corresponding to axial guide slots on a holder on front end thereof is fastened on a housing of a laser scanning unit;
   the holder with an inner tube part whose rear end faces the laser diode and the collimator lens is mounted in the front end thereof so that the laser beam passes through the inner tube part of the holder and the collimator lens and then projects out; a radial lug extends from outer surface of the holder is disposed with a plurality of axial guide slots that are parallel with a central axis of the inner tube part of the holder; the diameter of the guide slot is larger than that of the guide pin so that the holder is disposed on the flange by the guide pin on the flange inserting the corresponding guide slot on the holder and a gap between the guide slot and the guide pin is used as space for displacement between the guide slot and the guide pin as well as calibration of the X, Y, and Z axes between the laser diode and the collimator lens; adhesive is filled into the gap between the guide slot and the guide pin and spaced apart from the collimator lens.

2. The device as claimed in claim 1, wherein the corresponding relationship between the guide pin on the flange and the guide slot on the holder is that two guide pins correspond to two guide slot, three guide pins correspond to three guide slot, or four guide pins correspond to four guide slot.

3. The device as claimed in claim 1, wherein the axial guide slots on the lug are open-ended.

4. The device as claimed in claim 1, wherein the axial guide slots on the lug are close-ended.

5. The device as claimed in claim 1, wherein the adhesive is UV-curing type adhesive that is hardened by UV light irradiation.

6. A laser device comprising:
   a) a laser diode for emitting a laser beam;
   b) a flange having a plurality of axial guide pins;
   c) a holder having:
      i) an inner tube part; and
      ii) a radial lug extending from an outer surface of thereof and having a plurality of axial guide slots being parallel with a central axis of the inner tube part, a plurality of axial guide slots, one of the plurality of axial guide pins corresponding to each of the plurality of axial guide slots, each guide slot of the plurality of axial guide slots has a diameter larger than a diameter of each guide pin of the plurality of guide pins forming a gap there between, each gap is used as space for displacement between the guide slot and the guide pin and for calibration of the X, Y, and Z axes between the laser diode and the collimator lens;

d) a collimator lens located in a first end of the inner tube part of the holder;

e) a ring located in a second end of the inner tube part of the holder and securing the collimator lens in the inner tube part, the collimator lens is located between the laser diode and the ring, the laser beam is projected into the first end of the inner tube part of the holder, through the collimator lens and then outwardly from the second end of the inner tube part of the holder; and f) an adhesive filling each gap between the plurality of guide slots and the plurality of guide pins, the adhesive is spaced apart from the collimator lens.

7. The device as claimed in claim 6, wherein the corresponding relationship between the guide pin on the flange and the guide slot on the holder is that two guide pins correspond to two guide slot, three guide pins correspond to three guide slot, or four guide pins correspond to four guide slot.

8. The device as claimed in claim 6, wherein the axial guide slots on the lug are open-ended.

9. The device as claimed in claim 6, wherein the axial guide slots on the lug are close-ended.

10. The device as claimed in claim 6, wherein the adhesive is UV-curing type adhesive that is hardened by UV light irradiation.

11. The device as claimed in claim 6, wherein the holder is spaced apart from the laser diode by the plurality of axial guide pins.

\* \* \* \* \*